United States Patent [19]

Kusters et al.

[11] 4,079,280
[45] Mar. 14, 1978

[54] QUARTZ RESONATOR CUT TO COMPENSATE FOR STATIC AND DYNAMIC THERMAL TRANSIENTS

[75] Inventors: John A. Kusters, San Jose; Jerry G. Leach, Cupertino; Michael C. Fischer, Santa Clara, all of Calif.

[73] Assignee: Hewlett-Packard Company, Palo Alto, Calif.

[21] Appl. No.: 692,151

[22] Filed: Jun. 2, 1976

[51] Int. Cl.² .................................... H01L 41/04
[52] U.S. Cl. .................................... 310/318; 310/361
[58] Field of Search ............... 310/8.1, 8.9, 9.0, 9.5, 310/9.8, 318, 361; 331/116 R, 154, 153; 73/339 A

[56] References Cited
U.S. PATENT DOCUMENTS

| | | | |
|---|---|---|---|
| 3,322,981 | 5/1967 | Brenig | 310/8.9 |
| 3,414,794 | 12/1968 | Wood | 310/8.9 |
| 3,463,945 | 8/1969 | Fewings | 310/8.9 |
| 3,553,602 | 1/1971 | Brothers et al. | 310/8.9 X |
| 3,561,832 | 2/1971 | Karrer et al. | 310/8.9 X |
| 3,826,931 | 7/1974 | Hammond | 310/8.1 |
| 3,882,332 | 5/1975 | Frymoyer | 310/8.1 |
| 3,967,143 | 6/1976 | Watanabe et al. | 310/8.1 |

*Primary Examiner*—Mark O. Budd
*Attorney, Agent, or Firm*—Allston L. Jones

[57] ABSTRACT

A method and apparatus utilizing a quartz crystal resonator with an orientation substantially equal to (yxwl) 21.93°/33.93° vibrating simultaneously in two thickness modes to accurately measure temperature and unknown frequencies or to provide a stable frequency signal source. By combining a quartz crystal resonator of the above type with either digital or analog compensation, the frequency-temperature deviation of one of the crystal mode frequencies is used as an internal thermometer and the second crystal mode frequency as a reference frequency signal. The frequency signal for the thermometer function is utilized by the compensation network to correct the measurements made with, or to stabilize, the frequency of the reference frequency signal. Additionally, the analog or digital compensation is accomplished by means of either a curve-fitting routine or an interpolation look-up table routine.

19 Claims, 8 Drawing Figures

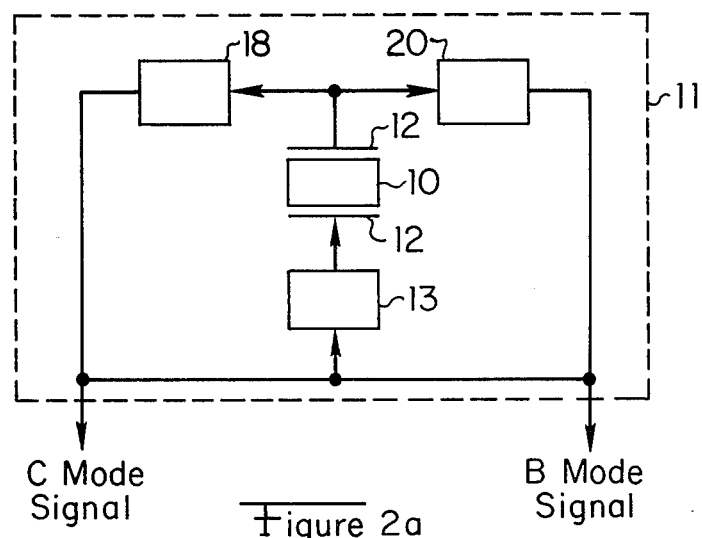
C Mode Signal   Figure 2a   B Mode Signal
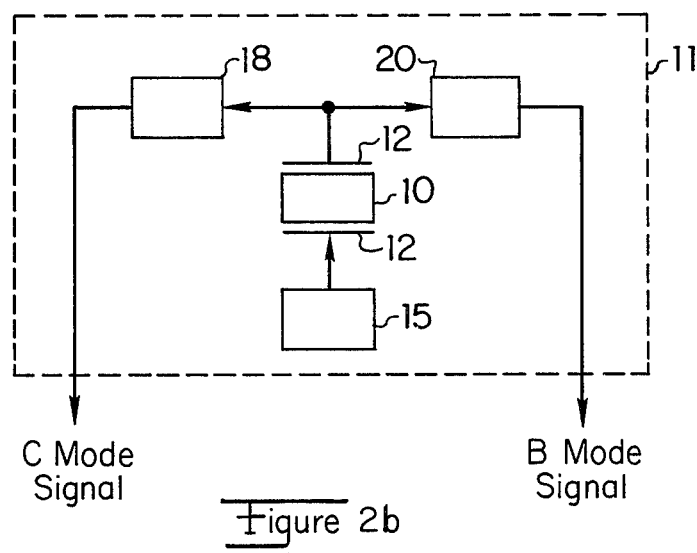
C Mode Signal   Figure 2b   B Mode Signal
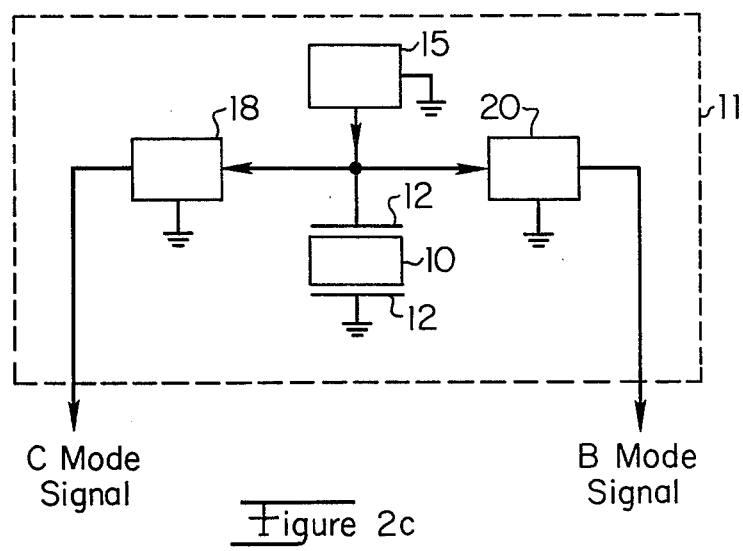
C Mode Signal   Figure 2c   B Mode Signal

QUARTZ RESONATOR CUT TO COMPENSATE FOR STATIC AND DYNAMIC THERMAL TRANSIENTS

SUMMARY OF THE INVENTION

The present invention includes a quartz crystal resonator with an orientation substantially equal to (yxwl) 21.93°/33.93° vibrating in two thickness modes simultaneously, and an analog or digital compensation network to provide accurate temperature or frequency measurements, or a stable reference frequency signal without the necessity of an oven or ancillary temperature monitoring devices.

To accomplish this, the frequency-temperature deviation characteristic of one of the thickness mode vibrations is used as a thermometer and the second mode frequency signal is used as a reference frequency signal or as the frequency stabilized output signal. In all of the illustrated embodiments of the invention, both of the mode signals are applied to the particular compensation network.

In the first embodiment of the invention, the frequency of the thermometer signal, or a linear combination of this signal and the reference frequency signal, e.g. the ratio or difference of these signals, is measured against the reference frequency signal. The signal representative of this measured value is then applied to a processor which determines the temperature of the quartz crystal resonator by means of a curve-fitting or look-up table interpolation routine. This embodiment is easily expanded to also measure the unknown frequency of an external signal against the reference frequency signal. A signal representative of this measured value is then transfered to the processor with the signal representative of the crystal temperature. The processor utilizes the temperature signal to determine the correction factor to be applied to the measured value of the unknown frequency made necessary by any temperature induced shift of the reference frequency. The correction factor is then applied to the signal corresponding to the measured value of the unknown frequency. Either the curve-fitting or the look-up table interpolation routine, mentioned above, is utilized in this application to generate the correction factor.

The second embodiment of this invention utilizes a similar approach to stabilize one of the mode frequencies against temperature induced frequency variations. As in the first embodiment, the frequency of the thermometer signal, whether it is the corresponding mode signal or a combination of both signals, is measured. Should the frequency measurement subsystem require a reference frequency, this reference frequency can be the second mode signal whose frequency is to be stabilized. The measured value of the thermometer signal is then applied to a processor wherein, as discussed above, a correction factor to the mode signal to be stabilized is generated. This correction factor signal and the mode signal to be stabilized are both then applied to a rate multiplier to generate a resultant output signal that is the stabilized frequency signal.

In the third embodiment of the present invention, the quartz crystal resonator is enclosed within an oven to stabilize the frequency of the reference frequency mode signal. This is accomplished by using the thermometer signal from the crystal in the same manner as in the second embodiment to determine a correction factor signal that is representative of the offset of the oven temperature from a preselected temperature above room temperature. This correction factor signal together with a fixed signal that is representative of the preselected ambient oven temperature are applied to a differential amplifier whose output signal is the input power signal to the oven for maintaining the preselected temperature within the oven.

BACKGROUND OF THE INVENTION

The resonate frequency of a quartz crystal is dependent on the elastic coefficients, the density, the thickness and overtone operation of the crystal. In addition, each of these factors vary with changes in the ambient temperature of the crystal, and, thus, resonate frequency variations occur.

Conventional methods for making the frequency of a quartz crystal resonator minimally dependent on temperature variations included three approaches. The first approach utilizes a heated oven to control the ambient temperature of the crystal resonator and thus control the frequency of that crystal. To further improve the frequency-temperature performance, the crystal resonator will typically be cut in one of the thermally compensated orientations for which the crystal resonator has inherently good frequency stability over a narrow temperature range. Two widely used singly rotated orientations are the AT and BT.

This approach generally yields crystal resonator controlled oscillators exhibiting the highest frequency stability currently obtainable. However, this approach experiences three potential drawbacks. First, in modern crystal resonator controlled applications, the oven will be the predominant power user. Second, a thermal stabilization time of many minutes is required when the crystal oven is first turned on even when available power is not limited. A large portion of this time is necessary to allow thermal gradients in the resonator to equilibriate and thus the advantage of instant warm up of transistor circuits is lost. Third, optimum temperature control of the quartz resonators is not possible unless the actual temperature of the quartz plate is known. Because the thermal sensing element is not in intimate contact with the resonator, errors in ambient control degrade frequency stability.

The second and third approachs utilize temperature compensation without the use of the oven. VCXO's (Voltage Controlled Crystal Oscillators) and TCXO's (Temperature Controlled Crystal Oscillators) represent the second approach. The VCXO typically includes a combination of a crystal resonator, an amplifier, and a voltage variable phase shifter. The voltage which is applied to the variable phase shifter represents a feedback signal derived from some form of temperature sensor, usually a thermistor or thermistor bridge, although more elaborate methods are possible.

The TCXO includes in the crystal resonator feedback path carefully selected reactive components which are not voltage variable, but which have a temperature-characteristic response which exactly compensates for the temperature behavior of the crystal resonator resulting in a device exhibiting a minimal frequency-temperature dependence.

The third approach utilizes novel characteristics of crystal resonators to obtain temperature compensation without the use of an oven. U.S. Pat. No. 3,826,931 entitled Dual Crystal Resonator Apparatus filed in the name of Donald L. Hammond and issued on July 30, 1974, describes a resonator apparatus which utilizes either a single quartz crystal vibrating in two selected modes or two quartz crystals each vibrating in a single selected mode to form a resonator output frequency that is the sum or difference of the two crystal frequencies and is minimally temperature dependent.

All three approaches experience a significant drawback. The temperature compensation described is static compensation, that is, temperature compensation is achieved only under conditions where the ambient temperature is slowly changing. Rapidly changing temperatures sufficient to cause thermal gradients through the crystal resonator, cause instantaneous frequency shifts orders of magnitude greater than the static stability of the device. For example, the AT cut resonator in an oven can have short term stabilities which are several parts in $10^{10}$. However, a 1° C temperature gradient through the crystal resonator can cause a sudden frequency shift of 36 parts in $10^6$.

Dynamic compensation for thermal transients was recently discovered by Richard Holland. He predicted a doubly-rotated crystal resonator cut, the TS, that has an orientation of (yxwl) 22.8°/34.3° (ANSI C83.3 - 1951 (R1972)) which exhibits inherently good frequency stability over a narrow temperature range suitable for obtaining good static compensation using either of the first two approaches discussed previously, and at the same time has inherent dynamic compensation for temperature transients. The TS orientation was introduced by Richard Holland in the following publications:

Richard Holland, "Nonuniformly Heated Anisotropic Plates: I. Mechanical Distortion and Relaxation", *IEEE Transactions on Sonics and Ultrasonics,* Vol. SU-21, July 1974, pp. 171-178, and Richard Holland, "Nonuniformly Heated Anisotropic Plates: II. Frequency Transients in AT and BT Quartz Plates", 1974 *Ultrasonics Symposium Proceedings,* IEEE Cat. #74CHO 896-1-5U, pp. 592-598.

At essentially the same time, another doubly-rotated crystal resonator cut, the SC, was predicted by Earl EerNisse to be (yxwl) 22.5°/34.3°, which is essentially the same as that predicted by Richard Holland. The SC orientation was introduced by Earl EerNisse in the following publication:

Earl EerNisse, "Quartz Resonator Frequency Shifts Arising from Electrode Stress", *Proceedings of the 29th Annual Symposium on Frequency Control* 1975, U.S. Army Electronics Command, Fort Monmouth, N.J., 28-30 May 1975, pp 1-4.

This cut exhibits the necessary frequency-temperature stability over narrow temperature ranges to obtain good static compensation with either the first or second approach. In addition, the SC is claimed to be frequency independent of internal stresses in the crystal resonator caused by deposited electrode patterns, crystal resonator mounts, and external applied stress in the plane of the crystal resonator surface. Both of these orientations offer thermal and mechanical stress sensitivity improvements over the AT and BT orientations but they still require operation in a controlled temperature environment over a narrow temperature range to achieve good frequency stability.

DESCRIPTION OF THE DRAWINGS

FIGS. 2*a-d* are block diagram representations of a variety of oscillator implementations wherein the included quartz crystal resonator is excited to vibrate in two thickness modes simultaneously.

DESCRIPTION OF THE PREFERRED EMBODIMENT

Investigations have shown that by using a crystal oriented within two degress of (yxwl) 21.93°/33.93° and operating in the fast shear, or B mode, and the slow shear, or C mode, the operation the crystal resonator is both statically and dynamically thermally compensated in the region of the crystal turnover temperature. This crystal can be referred to as being a TTC (Thermal Transient Compensated) type. It is widely known that the frequency-temperature behavior of any precision cut quartz resonators can be well represented by a power series expansion. A crystal of the above orientation has a frequency-temperature curve wherein the contribution of the fourth and higher order terms is typically less than one part in $10^8$, over a temperature range of two hundred degrees Celcius. The shape of this curve can be expressed algebraically as:

$$f = f_o [1 + aT + bT^2 + cT^3] \qquad (1)$$

where
$f_o$ is the resonant frequency at a selected reference temperature, $a$, $b$, and $c$ are first, second and third order temperature coefficients of frequency, and T is the value of the actual crystal temperature minus the value of the selected reference temperature.

It is well known that crystal orientations exist for which a single crystal can be driven to cause the crystal to vibrate in a plurality of thickness modes simultaneously. This is possible since the three thickness modes of motion are orthogonal and can exist simultaneously without mutually interfering with each other.

Figure 1:
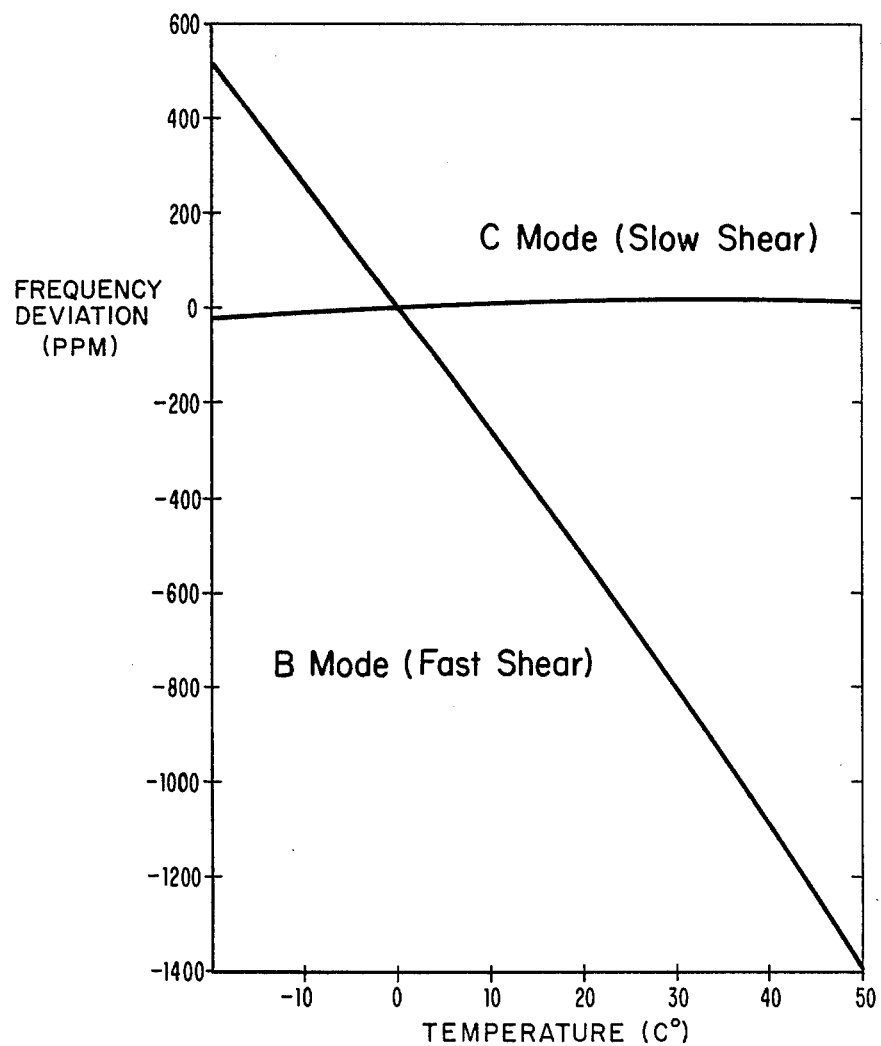
FIG. 1 is a plot of the frequency deviation versus temperature for the B and C mode frequencies of a quartz crystal resonator of the (yxwl) 21.93°/33.93° orientation.

FIG. 1 shows a representative plot of the temperature-frequency deviation of the B (fast shear) and C (slow shear) modes of a quartz resonator of the (yxwl) 21.93°/33.93° orientation. These temperature-frequency deviation curves show that the B mode frequency variation is predominantly linear and the C mode frequency variation is predominantly third order over the 70° Celsius range of FIG. 1. These frequency variations are approximately 1900 PPM (parts per million) for the B mode frequency and 25 PPM for the C mode frequency.

In a crystal resonator of this type, the B mode frequency variations can be used to sense the plate temperature of the crystal and thus provide a means whereby errors caused by the temperature sensitivity of the C mode frequency can be corrected when the C mode frequency is used as a frequency or time base reference or a frequency source.

Any of these applications can be achieved by utilizing a curve fitting routine, or a look-up table and interpolation. In either of the curve fitting or look-up table implementations, the initial step is to measure both the B and C mode frequencies at selected temperatures over the required operating range. These values can then be used to either derive the coefficients of the selected curve fitting expression, or to determine individual entries for a look-up table at each of the selected temperatures.

In a curve fitting implementation, the C mode frequency signal of the resonator can be used as the time base signal for measuring the frequency value of a second selected frequency signal.

Since the C mode frequency varies with temperature variations, the measured frequency will be incorrect. The relative error of the measured signal can be defined as:

$$\delta f = \frac{f_s - f_{st}}{f_{st}} \qquad (2)$$

where
$f_s$ is the measured value of the selected frequency signal and $f_{st}$ is the true value of the same signal.
The true value of this signal can be expressed as $$f_{st} = \frac{f_s}{1 + \delta f} \qquad (3)$$

By means of known frequency counter principles (Hewlett-Packard Company Application Note 172), the relative error of the C mode frequency signal is equivalent to $\delta f$ and can be expressed as:

$$\delta f = \frac{f_C - f_{C_o}}{f_{C_o}} \qquad (4)$$

where
$f_C$ is the frequency value of the C mode signal at the operating temperature of the TTC crystal and $f_{co}$ is the selected reference frequency of the C mode frequency signal.
The actual frequency of the C mode time base can be expressed as a polynomial in temperature as:

$$f_C = f_{C_o}(1 + A_C T + B_C T^2 + C_C T^3 + \ldots) \qquad (5)$$

where
$A_C, B_C, C_C, \ldots$, are the first, second, third, ..., order temperature coefficients of frequency and T is normalized temperature. By substituting $f_c$ of equation 5 into equation 4, the error expression becomes $$\delta f = A_C T + B_C T^2 + C_C T^3 + \ldots \qquad (6)$$

The resultant value from equation 6 can then be inserted into equation 3 to determine the true frequency of the selected frequency signal, or to stabilize the frequency of the C mode frequency by performing the following calculation:

$$f_{C_o} = \frac{f_C}{1 + \delta f} \qquad (7)$$

Therefore, by knowing the appropriate coefficients and the normallized temperature, T, the correction factor can be computed and either equation 3 used to derive the correct measured frequency, or equation 4 used to correct the system output frequency.

The TTC crystal has essentially a build-in thermometer in the B-mode response. This is predominantly a linear temperature coefficient mode with a slope large enough so that $f_B$-$f_C$ (the difference in the two mode frequencies) is always positive and single valued.

In the proposed implementation, the true B-mode frequency, $f_{B_T}$, can be measured using the actual C-mode frequency, $f_C$, as a time base. This of course gives rise to an error in the measured frequency, $f_B$. The relative error again is identical and is given by:

$$\delta f = \frac{f_B - f_{B_T}}{f_{B_T}} \qquad (8)$$

After selecting a reference frequency, $f_{C_o}$, we can measure $f_B$ and $f_C$ as a function of temperature using a precision time base, and then construct a table of the apparent $f_B$ if measured with $f_C$ as a time base by using equations 4 and 8 to form:

$$f_B(T) - f_{B_T}(T) \left\{ 1 + \frac{f_C(T) - f_{C_o}}{f_{C_o}} \right\}. \qquad (9)$$

We now have a table of the apparent $f_B$ frequencies versus a normallized temperature, T. Therefore, a polynomial can be constructed which has the form:

$$T = A' + B'F_B + Cf_B^2 + D'f_B^3 + \ldots \qquad (10)$$

where
$A', B', C', D', \ldots$ are the zeroth, first, second, third . . . order frequency coefficients of temperature.
This expression can then be substituted into equation 6 yielding an expression of the following form:

$$\delta f = A + Bf_B + Cf_B^2 + Df_B^3 + \ldots \qquad (11)$$

Hence, by measuring the B-mode frequency signal using the C-mode signal as a frequency base, a correction factor polynomial valid over the entire calibration range can be generated. This correction factor can then be used with either of equations 3 or 4 to correct the measured value of the selected frequency signal, or to stabilize the C mode frequency signal by shifting its frequency as necessary, respectively.

To implement the curve-fitting technique, the coefficients of equation 10 or 11 are determined initially for the individual crystal or for a production class of crystals, and stored in the apparatus as fixed constants over the entire operational temperature range. In operation, $f_B$ which can be the B mode frequency or a selected first order function of both the B and C mode frequencies, e.g., the ratio or difference, is formed, measured, and applied to a processor wherein signals representative of the expressions of equation 10 or 11 are formed and added to form yet another signal that is representative of the crystal temperature or the desired correction factor.

In the look-up table technique, the value of the desired correction factor or of the temperature is initially stored in the look-up table with $f_B$, the value of the B mode frequency or of a selected function of both the B and C mode frequencies, as a pointer at each selected temperature. In operation, $f_B$ is formed and measured to generate a pointer to the desired information in the look-up table. If the value of $f_B$ is the same as one of the pointers of the look-up table, the information stored at that location is transfered to a processor. The value of $f_B$ may be between two pointer values of the look-up table. When this occurs, the look-up table values associated with these adjacent pointers are transfered to the processor where an appropriate interpolation is performed to determine the value of the temperature or correction factor associated with this intermediate pointer.

The interpolation technique used when the value of the pointer is intermediate two other pointer values in many applications will be linear. This then requires that the initial measurements of the crystal frequencies be taken at selected temperatures which are sufficiently close together such that the desired correction factor or temperature curves as a function of $f_B$ between these temperature values are predominantly linear. If these curves are non-linear between the selected temperture it then would be necessary to include polynomial coefficients in the look-up table for each pointer. These coefficients would then be used in any known interpolation polynomial to determine the correction factor for the intermediate pointer.

In FIGS. 2 through 6, the arrows which are shown, indicate the direction of forward power or information flow in each of the implementations.

Figure 2D:
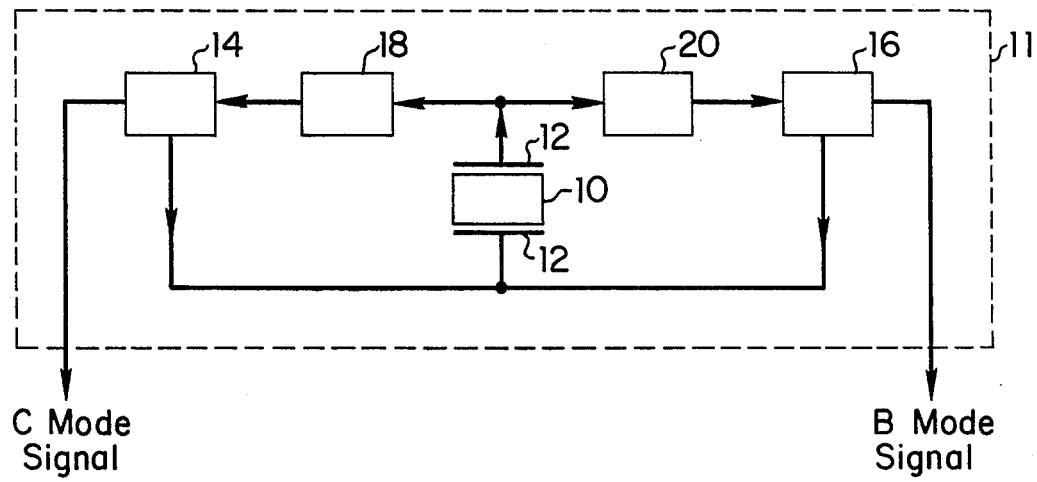

Referring now to FIGS. 2a-d, there is shown a variety of implementations of an oscillator 11 wherein a doubly rotated TTC quartz crystal resonator 10 is vibrating in two thickness modes simultaneously. In FIG. 2a there is shown a single quartz resonator 10 of the TTC type discussed above, disposed between electrodes 12 and vibrated simultaneously in its B and C modes by application of an A-C signal to electrodes 12 by amplifier 13. This amplifier has two inputs which it combines internally to excite both modes of vibration within resonator 10 at different frequencies, with the frequencies of amplifier 13 corresponding to the B and C mode frequencies of the crystal. Filter networks 18 and 20, each having appropriate poles and/or zeros relative to said frequencies, will separate the energy from the vibration in the two modes through the single pair of electrodes 12. In this configuration, the C and B mode frequency signals are provided for subsequent circuitry on the output ports of filter networks 18 and 20, respectively.

In FIG. 2b oscillator 11 is shown with the same configuration as in FIG. 2a with amplifier 13 replaced by a negative resistance circuit 15. Negative resistance circuit 15, as does amplifier 13, excites the two separate modes of vibration of resonator 10. FIG. 2c shows a second implementation of oscillator 11 using a negative resistance circuit 15. In this circuit configuration negative resistance circuit 15 has been disconnected from the lower electrode 12 as shown in FIG. 2b, and reconnected to the node between filter networks 18 and 20 and upper electrode 12. Additionally, lower electrode 12, negative resistance circuit 15, and filter networks 18 and 20 are all referenced to the same return bus. Oscillator 11 of FIG. 2d shows a circuit configuration with amplifiers 14 and 16 each designed to excite a separate mode of vibration within resonator 10 with amplifiers 14 and 16 corresponding to the C and B mode frequencies, respectively. Also shown in FIG. 2d are electrodes 12 and filter networks 18 and 20 which are included for the same purposes as discussed in relation to FIG. 2a. In this configuration the C and B mode frequency signals are provided for subsequent circuitry from amplifiers 14 and 16 respectively.

Figure 3:
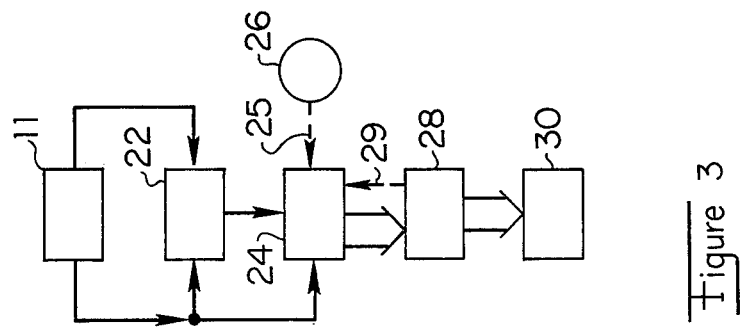
FIG. 3 is a block diagram of a first embodiment of the present invention wherein the quartz crystal resonator with an open loop compensation network is used as a thermometer or to accurately measure the frequency of an unknown signal.

In FIG. 3, there is shown a first embodiment of the invention with open loop temperature compensation. This implementation can be used as a thermometer or a means for applying a correction factor to a measurement of the unknown frequency of an external signal where the C mode frequency provides the time base reference. The B and C mode frequency signals are applied to a mixer 22 from oscillator 11. From these signals, mixer 22 produces a difference frequency signal, $f_B$, which is then applied to a frequency measuring counter subsystem 24. The C mode frequency signal is also applied to counter subsystem 24 as a time base reference. If this implementation is to be used to measure the frequency of a third signal, this signal is also applied to counter subsystem 24 from an external source 26 as indicated by broken arrow 25. Using the C mode frequency signal as a reference signal, the apparent frequencies of the $f_D$ signal and the third signal are measured by counter subsystem 24.

Counter subsystem 24 then converts both frequency measurements to electrical signals with a format that is compatible to subsequent circuit elements. These measurement signals are then transferred to a processor 28 either serially or in parallel. This transfer of the measurement signals may be made and transferred under the control of processor 28 as indicated by broken arrow 29.

Processor 28 can be implemented to apply either the curve fitting technique or the look-up table technique as discussed above with digital or analog circuits. Examples of these various implementations are:

Frequency measurement subsystems 24 and 38 - Hewlett-Packard Models 5300B, 5312A and 5308A Digital curve fitting processor 28 - Hewlett-Packard Model 9825A Analog curve fitting processor 28 — Operational amplifiers with non-linear function generators composed of resistors, diodes and transistors Digital look-up table processor 28 — Hewlett-Packard Model 9825A Analog look-up table processor 28 — Operational amplifiers and multiple threshold circuits with resistive ladders Rate multiplier 42 — Texas Instruments SN5497

In each of these implementations, processor 28 utilizes the measurement signals to generate a signal that accurately represents the temperature of resonator 10 or to generate a corrected measurement signal that accurately represents the actual frequency of the third signal. This accurately representative signal is then coupled to a display subsystem 30 which then communicates the desired temperature or frequency information to an operator and/or additional systems elements.

Figure 4:
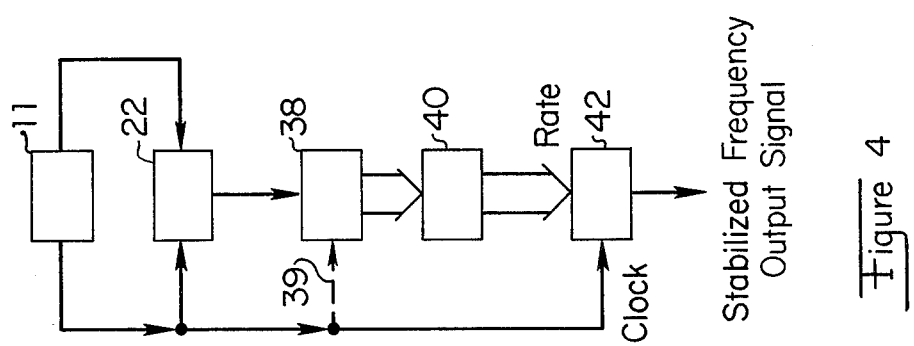
FIG. 4 is a block diagram of a second embodiment of the present invention wherein the quartz crystal resonator with an open loop compensation network is used as a stable frequency source.

FIG. 4 shows another embodiment of the present invention which also employs open loop temperature compensation. This implementation provides a stabilized frequency output signal that is derived from the C mode frequency signal from oscillator 11. In addition to oscillator 11 and mixer 22, this embodiment includes a frequency measuring subsystem 38, a subtractor 40, and a rate multiplier 42.

Mixer 22 receives the B and C mode frequency signals from oscillator 11 from which it generates a difference frequency signal, $f_B$. The difference frequency signal is then coupled to frequency measuring subsystem 38. Frequency measuring subsystem 38 consists of conventional digital binary circuitry, analog frequency to voltage conversion circuitry, or a combination of analog-digital tachometric circuitry. This frequency measuring subsystem may require a reference frequency in which case the resultant measurement is the ratio between the reference frequency and the measured frequency. Should a reference frequency signal input be utilized it could be the C mode frequency signal as indicated by dashed line 39.

Frequency measuring subsystem 38 in turn generates a first electrical signal corresponding to the measured difference frequency, $f_B$. The first electrical signal is then applied to subtractor 40 where it is subtracted from a second signal that is representative of a B and C mode frequency difference where no correction to the C mode frequency is required.

The result of this subtraction produces a third electrical signal that is applied to a processor section of subtractor 40 to generate a correction factor signal to provide the necessary frequency shift to the C mode frequency. This processor section of subtractor 40 can be implemented and operates as does processor 28 of FIG. 3. Rate multiplier 42 receives two input signals, the correction factor signal at its rate input port and the C mode frequency signal at its clock input port. The resultant output signal from rate multiplier 42 is a stabilized frequency output signal whose frequency is that of the clock signal, i.e., C mode frequency signal, shifted in response to the rate input signal, i.e., correction factor signal.

Figure 5:
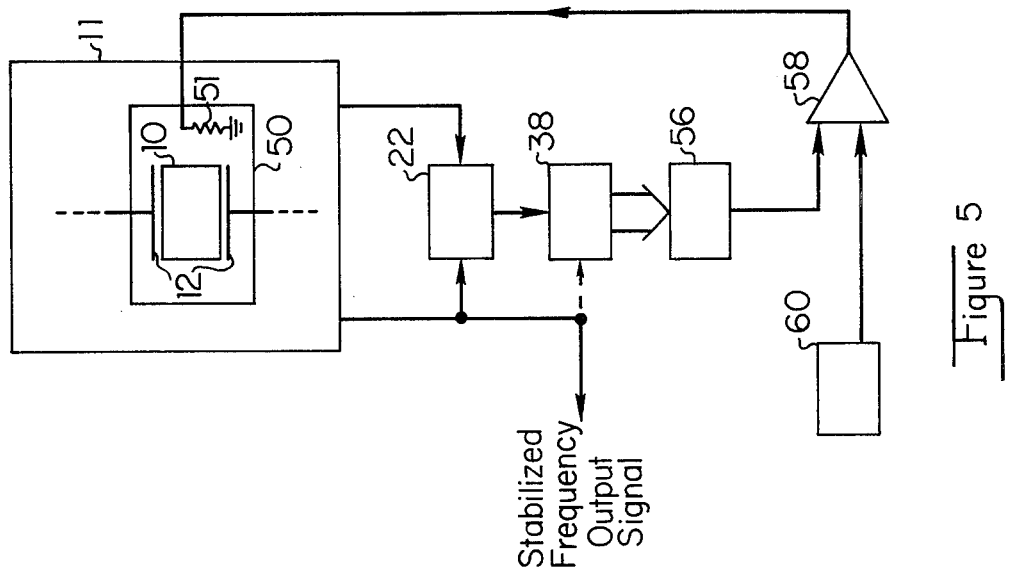
FIG. 5 is a block diagram of a third embodiment of the present invention wherein a quartz crystal resonator with a closed loop feedback network is used as a stable frequency source.

FIG. 5 shows the same basic dual frequency oscillator 11 and mixer 22 as shown in FIGS. 3 and 4. In addition, resonator 10 and electrodes 12 of oscillator 11 are shown within an oven 50 that also contains a heater 51 for controlling the operating temperature of resonator 10. Also shown in this figure is frequency measuring subsystem 38 as shown in FIG. 4, a processor 56, a differential amplifier 58 having two input terminals, and a reference signal generator 60.

This embodiment differs significantly from the others where the temperature of the resonator 10 is allowed to follow the ambient temperature. This embodiment utilizes heater 51 to elevate the temperature of resonator 10 above ambient and to hold this temperature very close to a predetermined value by varying the amount of electrical power dissipated in heater 51 in response to changes in heat loss due, for example, to varying ambient temperatures.

To counteract temperature drifts within oven 50, the temperature dependent difference frequency signal output of mixer 22 (discussed above) is utilized to control a null seeking closed feedback loop which includes frequency measuring subsystem 38, processor 56, differential amplifier 58, and heater 51. The difference frequency signal from mixer 22 is applied to frequency measuring subsystem 38, where the frequency of that signal is measured to form a representative electrical signal which is then transferred to processor 56. Processor 56 then utilizes this electrical signal to generate a temperature correction factor signal very much as processor 28 of FIG. 3 generates a measured frequency correction factor signal. However, since oven 50 is maintaining the temperature very near the desired value, the polynomial or the curve fitting technique, if used, can be very much simpler, namely, one or two terms.

Reference signal generator 60 is preset to develop a signal level that when compared to the temperature correction factor signal from processor 56 will cause heater 51 to establish the selected temperature within oven 50. To perform this comparison, the signal developed by reference signal generator 60 and the temperature correction factor signal from processor 56 are applied individually to the two input terminals of differential amplifier 58. Differential amplifier 58 develops a large, variable, amplified difference signal from its two input signals. This constantly variable output difference signal from differential amplifier 58 is then applied to heater 51 to continually vary the power applied thereto. These changes in the power supplied to heater 51 cause the temperature in oven 50 to remain within a selected tolerance of the selected temperature thereby correcting for temperature drifts that cause variations in the B and C mode frequencies of resonator 10, as discussed above.

In each of the above oscillating circuits the nominal operating frequency may be made externally adjustable and/or controllable by the inclusion of mechanically and/or electrically variable components in the fashion of present art as seen in practically all crystal oscillators (e.g., VCXO controls). This same external control result can also be achieved by applying the controlling influence to any appropriate point in the compensation loop (e.g., a varactor to vary the phase shift in one resonant frequency path as a result of a feedback signal to maintain that frequency within selected tolerance limits).

We claim:

1. Signal generation apparatus comprising:
    a quartz crystal resonator having a selected crystallographic orientation that is equal to (yxwl) 21.93°/33.93° ±2° for providing static and dynamic thermal transient compensation, and having first and second thickness modes of vibration in response to an electric field applied thereto, vibration in each of said modes being characterized by a selected frequency-temperature deviation characteristic;
    means for generating and supplying said electric field to said quartz crystal resonator and for isolating the first and second frequency signals of said first and second modes of vibration, respectively; and
    compensation means coupled to receive at least one of said first and second frequency signals for production of an output signal that is relatively independent of the temperature induced deviations of said first and second frequency signals, one of said first and second frequency signals received by the compensation means being representative of the temperature of said quartz crystal resonator and used to generate an intermediate signal used in the generation of the output signal.

2. Signal generation apparatus as in claim 1 wherein:
    said one of the first and second frequency signals and its corresponding thickness mode of vibration comprises the B mode frequency signal and its B mode of vibration of the quartz crystal resonator each having a predominantly linear frequency-temperature characteristic over a selected temperature range; and said other of the first and second frequency signals and its corresponding thickness mode of vibration comprises the C mode frequency signal and its C mode of vibration of the quartz crystal resonator each having a predominantly third order frequency-temperature characteristic over a selected temperature range.

3. Signal generation apparatus as in claim 2 wherein said compensation means comprises:
input means coupled to said electric field generating and supplying means for receiving at least the B mode frequency signal of said B and C mode frequency signals and for providing a third signal whose frequency is representative of the internal temperature of the quartz crystal resonator;
counter means coupled to receive, and for counting the frequency of said third signal and generating a fourth signal with an encoded value that is representative of the counted frequency value of the third signal; and
processor means coupled to receive said fourth signal for producing therefrom a fifth signal with an encoded value that is a function of the temperature of the quartz crystal resonator, the fifth signal being said intermediate signal.

4. Signal generation apparatus as in claim 3 wherein said processor means produces the fifth signal by a curve fitting technique.

5. Signal generation apparatus as in claim 3 wherein said processor means produces the fifth signal by a look-up table and interpolation technique.

6. Signal generation apparatus as in claim 3 wherein said compensation means further includes display means coupled to receive the fifth signal for displaying its encoded value as the output signal wherein the encoded value of the fifth signal is representative of an accurate measure of the internal temperature of the quartz crystal resonator.

7. Signal generation apparatus as in claim 3 wherein:
said counter means is further coupled to receive an unknown frequency signal from an external signal source for counting the frequency of the unknown signal and for generating a sixth signal with an encoded value that is representative of the counted frequency value of the unknown signal, said C mode frequency signal also being coupled to the counter means to provide a time base reference signal for the counting of the frequency of both the third and the unknown frequency signals;
said fifth signal has an encoded value that is representative of a correction factor to the measured value of the frequency of the unknown signal using the temperature sensitive C mode frequency signal; and
said processor means is further coupled to receive the sixth signal for algebraically combining the encoded values of the fifth and sixth signals to form a value to be encoded into the output signal, said encoded value of the output signal being representative of an accurate measure of the frequency of the unknown signal corrected for the temperature-frequency deviation of the C mode frequency.

8. Signal generation apparatus as in claim 7 wherein said compensation means further includes display means coupled to receive the output signal for displaying its encoded value.

9. Signal generation apparatus as in claim 3 wherein: said compensation means further comprises:

oven means surrounding said quartz crystal resonator for maintaining a preselected temperature therewithin to stabilize said C mode frequency signal within a first selected accuracy as the output signal;
differential amplifier means coupled to said oven means for applying thereto a power signal to maintain the preselected temperature therewithin within a second selected accuracy; and
reference signal generator means coupled to said differential amplifier means for applying thereto a preset signal level to establish said preselected temperature within said over means; and
said fifth signal being a feedback signal whose encoded value represents a temperature correction factor is also coupled to the differential amplifier means wherein it and the signal from the reference signal generator means are algebraically combined to form the power signal.

10. Signal generation apparatus as in claim 3 wherein:
said processor means includes means for subtracting from the encoded value of the fourth signal a value that is representative of an encoded value of the fourth signal where the C mode frequency is within a selected accuracy of a preselected output signal frequency forming from the subtraction result a sixth signal, from the sixth signal the processor means generates the fifth signal, said fifth signal having an encoded value representative of a correction factor necessary to shift the C mode frequency to maintain the output signal within the selected accuracy; and
said compensation means further comprises rate multiplier means having clock and rate input ports, said clock and rate input ports being coupled to receive the C mode frequency signal and the fifth signal, respectively, and wherein an output signal is generated having a frequency that corresponds to the C mode frequency shifted in response to the fifth signal, said output signal having a frequency within the selected accuracy.

11. A method of generating a signal, said method comprising the steps of:
exciting a quartz crystal resonator having a selected crystallographic orientation that is equal to (yxwl) 21.93°/33.93° ± 2° for providing static and dynamic thermal transient compensation into simultaneous vibration in a first and a second independent thickness mode of vibration, vibration in each of said modes being characterized by a selected frequency-temperature deviation characteristic;
isolating from each other a first and a second frequency signal corresponding to the first and the second mode of vibration respectively; and
generating from at least one of said first and second frequency signals an output signal that is relatively independent of the temperature induced deviations of said first and second frequency signals, one of said first and second frequency signals utilized in the generation of the output signal being representative of the temperature of said quartz crystal resonator and used to generate an intermediate signal used in the generation of the output signal.

12. A method of generating a signal as in claim 11 wherein:
said one of said first and second frequency signals and its corresponding thickness mode of vibration comprises the B mode frequency signal and its B mode of vibration of the quartz crystal resonator each having a predominantly linear frequency-temperature characteristic over a selected temperature range; and said other of the first and second frequency signals and its corresponding thickness mode of vibration comprises the C mode frequency signal and its C mode of vibration of the quartz crystal resonator each having a predominantly third order frequency-temperature characteristic over a selected temperature range.

13. A method of generating a signal as in claim 12 wherein the step of generating an output signal includes:

producing a third signal whose frequency is representative of the internal temperature of the quartz crystal resonator from at least one of the B and C mode frequency signals;

counting the frequency of the third signal and generating a fourth signal with an encoded value that is representative of the counted frequency value of the third signal; and processing the fourth signal to produce a fifth signal with an encoded value that is a function of the temperature of the quartz crystal resonator, the fifth signal being said intermediate signal.

14. A method of generating a signal as in claim 13 wherein the step of processing the fourth signal includes:

predetermining and storing coefficients of an $n^{th}$ order polynomial that is a function of the encoded value of the fourth signal to accurately produce the encoded value of the fifth signal over the entire selected temperature range; and algebraically combining the encoded value of the fourth signal with the stored coefficients of the $n^{th}$ order polynomial to form the encoded value of the fifth signal.

15. A method of generating a signal as in claim 13 wherein the step of processing the fourth signal includes:

predetermining the values to be encoded in each of the fourth and fifth signals with the quartz crystal resonator operating at a plurality of selected temperatures;

prestoring the individual predetermined values to be encoded in the fifth signal in a storage device with the corresponding predetermined values of the fourth signal as pointers thereto;

applying the actual encoded value of the fourth signal to the storage device;

identifying a plurality of pointers having values between which the actual encoded value of the fourth signal falls; and interpolating between the stored values to be encoded into the fifth signal corresponding to said plurality of pointers utilizing the plurality of pointers and the actual value encoded in the fourth signal;

said plurality of pointers being a single pointer when there is agreement between the actual encoded value of the fourth signal and one of the stored pointers wherein the value to be encoded in the fifth signal is the stored value corresponding to said single pointer.

16. A method of generating a signal as in claim 13 wherein the step of generating an output signal further includes the step of displaying the encoded value of the fifth signal as the output signal, said encoded value of the fifth signal being representative of an accurate measure of the internal temperature of the quartz crystal resonator.

17. A method of generating a signal as in claim 13 wherein the step of generating an output signal further includes the steps of:

utilizing the C mode frequency signal as a time base reference for counting the frequency of other signals;

counting the frequency of an externally applied unknown frequency signal and generating a sixth signal with an encoded value that is representative of the counted frequency value of the unknown frequency signal using the temperature sensitive C mode frequency signal; and algebraically combining the encoded values of the fifth and sixth signals forming a value to be encoded into the output signal, the encoded value of the output signal being representative of an accurate measure of the frequency of the unknown signal, the encoded value of said fifth signal being a correction factor to the encoded value of the sixth signal.

18. A method of generating a signal as in claim 13 wherein the step of generating an output signal further includes the steps of:

enclosing the quartz crystal resonator in an oven for evenly heating the resonator to a preselected temperature that is maintained within a first selected accuracy to stabilize the frequency of the C mode signal within a second selected accuracy as the output signal;

combining the fifth signal with a reference signal from an external signal source, said reference signal having a preset signal level to establish the preselected temperature within the oven, and said fifth signal being a feedback signal whose encoded value represents a correction factor for the offset of the temperature of the quartz crystal resonator from the preselected temperature; and applying the combination signal of the fifth and reference signals to the oven for establishing and maintaining the temperature of the quartz crystal resonator within first selected accuracy of the preselected temperature.

19. A method of generating a signal as in claim 13 wherein:

the step of processing the fourth signal includes the steps of:

subtracting from the encoded value of the fourth signal a value that is representative of an encoded value of the fourth signal where the C mode frequency is within a selected accuracy of a preselected frequency to form a sixth signal having an encoded value equivalent to the result of the subtraction;

converting the encoded value of the sixth signal into a value representative of a correction factor necessary to shift the C mode frequency to maintain this frequency within the selected accuracy of the preselected frequency; and encoding the C mode frequency correction factor value into the fifth signal; and the step of generating an output signal further includes the step of shifting the frequency of the C mode signal in response to the fifth signal to produce the output signal having the preselected frequency within the selected accuracy.

* * * * *

UNITED STATES PATENT AND TRADEMARK OFFICE
CERTIFICATE OF CORRECTION

PATENT NO. : 4,079,280
DATED : March 14, 1978
INVENTOR(S) : John A. Kusters, Jerry G. Leach, Michael C. Fischer It is certified that error appears in the above-identified patent and that said Letters Patent are hereby corrected as shown below:

Column 2, line 10, delete "resonate" and insert -- resonant --; line 14, delete "resonate" and insert -- resonant --;

Column 4, line 24, between "operation" and "the" insert -- of --;

Column 5, line 44, delete "$f_{co}$" and insert -- $f_{Co}$ --;

Column 5, line 55, delete "$f_c$" and insert -- $f_C$ --;

Column 6, line 35, equation 10 should read

-- $T = A' + B' f_B + C'f_B^2 + D'f_B^3 + \ldots$ --;

Column 12, line 13, delete "over" and insert -- oven --

Signed and Sealed this

Twelfth Day of September 1978

[SEAL]

Attest:

RUTH C. MASON
*Attesting Officer*

DONALD W. BANNER
*Commissioner of Patents and Trademarks*